US009627091B1

(12) United States Patent
Chan et al.

(10) Patent No.: US 9,627,091 B1
(45) Date of Patent: Apr. 18, 2017

(54) MEMORY DEVICE AND STRESS TESTING METHOD OF SAME

(71) Applicant: WINBOND ELECTRONICS CORPORATION, Taichung (TW)

(72) Inventors: Johnny Chan, Fremont, CA (US); Hsi-Hsien Hung, Palo Alto, CA (US)

(73) Assignee: Winbond Electronics Corporation, Taichung (TW)

( * ) Notice: Subject to any disclaimer, the term of this patent is extended or adjusted under 35 U.S.C. 154(b) by 0 days.

(21) Appl. No.: 15/213,030

(22) Filed: Jul. 18, 2016

(51) Int. Cl.
| G11C 29/00 | (2006.01) |
| G11C 29/50 | (2006.01) |
| G11C 8/10 | (2006.01) |
| G11C 29/04 | (2006.01) |

(52) U.S. Cl.
CPC .............. G11C 29/50 (2013.01); G11C 8/10 (2013.01); *G11C 29/04* (2013.01); *G11C 2029/5004* (2013.01)

(58) Field of Classification Search
CPC ......... G11C 29/00; G11C 29/02; G11C 29/04; G11C 29/006; G11C 29/50; G11C 8/10; G11C 2029/5004
USPC ...................... 365/201, 200, 185.02, 185.09
See application file for complete search history.

(56) References Cited

U.S. PATENT DOCUMENTS

| 6,697,992 | B2 | 2/2004 | Ito et al. | |
| 6,973,005 | B2 * | 12/2005 | Chevallier | G11C 7/18 |
| | | | | 257/E27.103 |
| 7,042,778 | B2 * | 5/2006 | Chevallier | G11C 7/18 |
| | | | | 257/E27.103 |
| 7,318,183 | B2 | 1/2008 | Ito et al. | |
| 2002/0018389 | A1 | 2/2002 | Ito et al. | |
| 2006/0044919 | A1 | 3/2006 | Taoka et al. | |
| 2009/0116288 | A1 | 5/2009 | Varkony | |
| 2012/0218845 | A1 * | 8/2012 | Takayama | G11C 7/12 |
| | | | | 365/201 |

FOREIGN PATENT DOCUMENTS

TW 548648 8/2003

* cited by examiner

*Primary Examiner* — Tan T. Nguyen
(74) *Attorney, Agent, or Firm* — Finnegan, Henderson, Farabow, Garrett & Dunner LLP

(57) ABSTRACT

A memory device includes a memory cell array and a control unit. The memory cell array includes a plurality of memory cells arranged in rows and columns, a plurality of word lines extending in a row direction and coupled to respective rows of the memory cells, and a plurality of local bit lines extending in a column direction and coupled to respective columns of the memory cells. The control unit is configured to program a selected one of the rows of memory cells to have a predetermined pattern of digital states, couple selected ones of the local bit lines to a global bit line and couple unselected ones of the local bit lines to ground based on the predetermined pattern, apply a stress voltage to the global bit line, and after a predetermined period of time, sense the digital states of the selected row of memory cells.

16 Claims, 5 Drawing Sheets

MEMORY DEVICE AND STRESS TESTING METHOD OF SAME

DESCRIPTION

Field of the Disclosure

The present disclosure relates to a memory device and a stress testing method of the memory device.

Background

Memory devices are typically used to store executable code and data for electronic devices. Many electronic devices operate for long periods of time, and continuously transfer large amounts of data in and out of their associated memory devices. Such continuous operation may deteriorate the performance of the memory devices. Thus, memory devices are stress tested to determine if they will perform according to design expectations to handle the stresses of runtime operation.

SUMMARY

According to an embodiment of the disclosure, a memory device includes a memory cell array and a control unit. The memory cell array includes a plurality of memory cells arranged in rows and columns, a plurality of word lines extending in a row direction and coupled to respective rows of the memory cells, and a plurality of local bit lines extending in a column direction and coupled to respective columns of the memory cells. The control unit is configured to program a selected one of the rows of memory cells to have a predetermined pattern of digital states, couple selected ones of the local bit lines to a global bit line and couple unselected ones of the local bit lines to ground based on the predetermined pattern, apply a stress voltage to the global bit line, and after a predetermined period of time, sense the digital states of the selected row of memory cells.

According to another embodiment of the disclosure, a method for stress testing a memory device includes providing a memory cell array including a plurality of memory cells arranged in rows and columns, a plurality of word lines extending in a row direction and coupled to respective rows of the memory cells, and a plurality of local bit lines extending in a column direction and coupled to respective columns of the memory cells. The method also includes programming a selected one of the rows of memory cells to have a predetermined pattern of digital states, coupling selected ones of the local bit lines to a global bit line based on the predetermined pattern, coupling unselected ones of the local bit lines to ground, applying a stress voltage to the global bit line, and after a predetermined period of time, sensing the digital states of the selected row of memory cells.

The accompanying drawings, which are incorporated in and constitute a part of this application, illustrate disclosed embodiments and, together with the description, serve to explain the disclosed embodiments.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1:
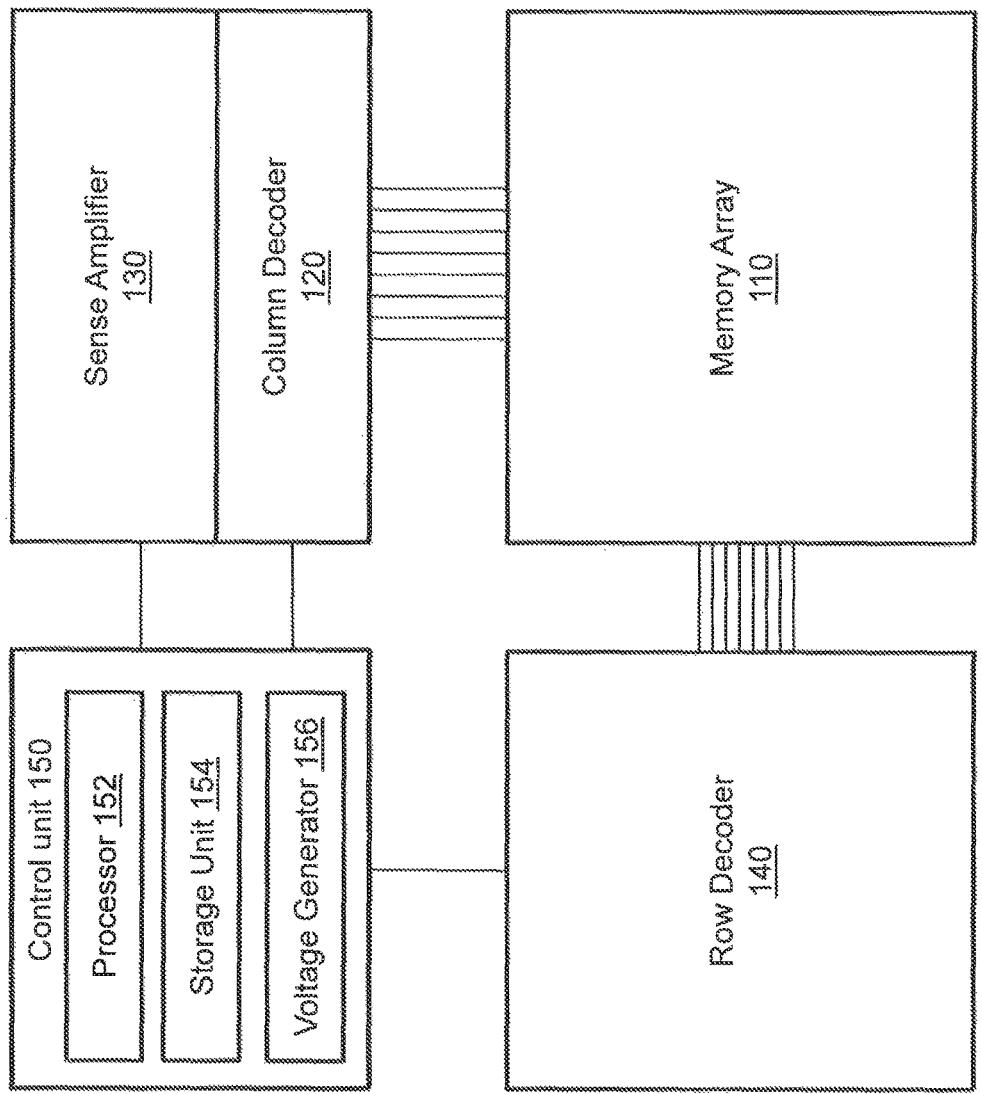
FIG. 1 is a schematic diagram of a memory device according to an illustrated embodiment.

FIG. 1 is a schematic diagram of a memory device 100, according to an illustrated embodiment. According to FIG. 1, memory device 100 includes a memory array 110 including a plurality of memory cells arranged in rows and columns. Memory device 100 also includes a column decoder 120, a sense amplifier 130, a row decoder 140, and a control unit 150. Column decoder 120 is coupled to a plurality of local bit lines in memory array 110 for accessing a column of memory cells in memory array 110. Row decoder 140 is coupled to a plurality of word lines in memory array 110 for accessing a row of memory cells in memory array 110. Sense amplifier 130 is coupled to memory array 110 for reading data stored in the memory cells in memory array 110. Although column decoder 120, sense amplifier 130, and row decoder 140 are illustrated as separate circuits, those skilled in the art will recognize that column decoder 120, sense amplifier 130, and row decoder 140 can be combined in one circuit.

Control unit 150 is coupled to column decoder 120, sense amplifier 130, and row decoder 140 for controlling operations of column decoder 120, sense amplifier 130, and row decoder 140 in response to commands from an external device (not shown). In the embodiment illustrated in FIG. 1, control unit 150 includes a processor 152, a storage unit 154, and a voltage generator 156. Storage unit 154 is configured to store instructions executed by processor 152 to control operations of column decoder 120, sense amplifier 130, and row decoder 140 in response to command signals from the external device. Processor 152 is a general-purpose processor that can be configured to execute the instructions stored in storage unit 154. Voltage generator 156 is configured to generate various voltages for controlling the operations of column decoder 120, sense amplifier 130, and row decoder 140. In an alternative embodiment, control unit 150 can include special-purpose logic circuits that are configured to control operations of column decoder 120, sense amplifier 130, and row decoder 140.

Figure 2:
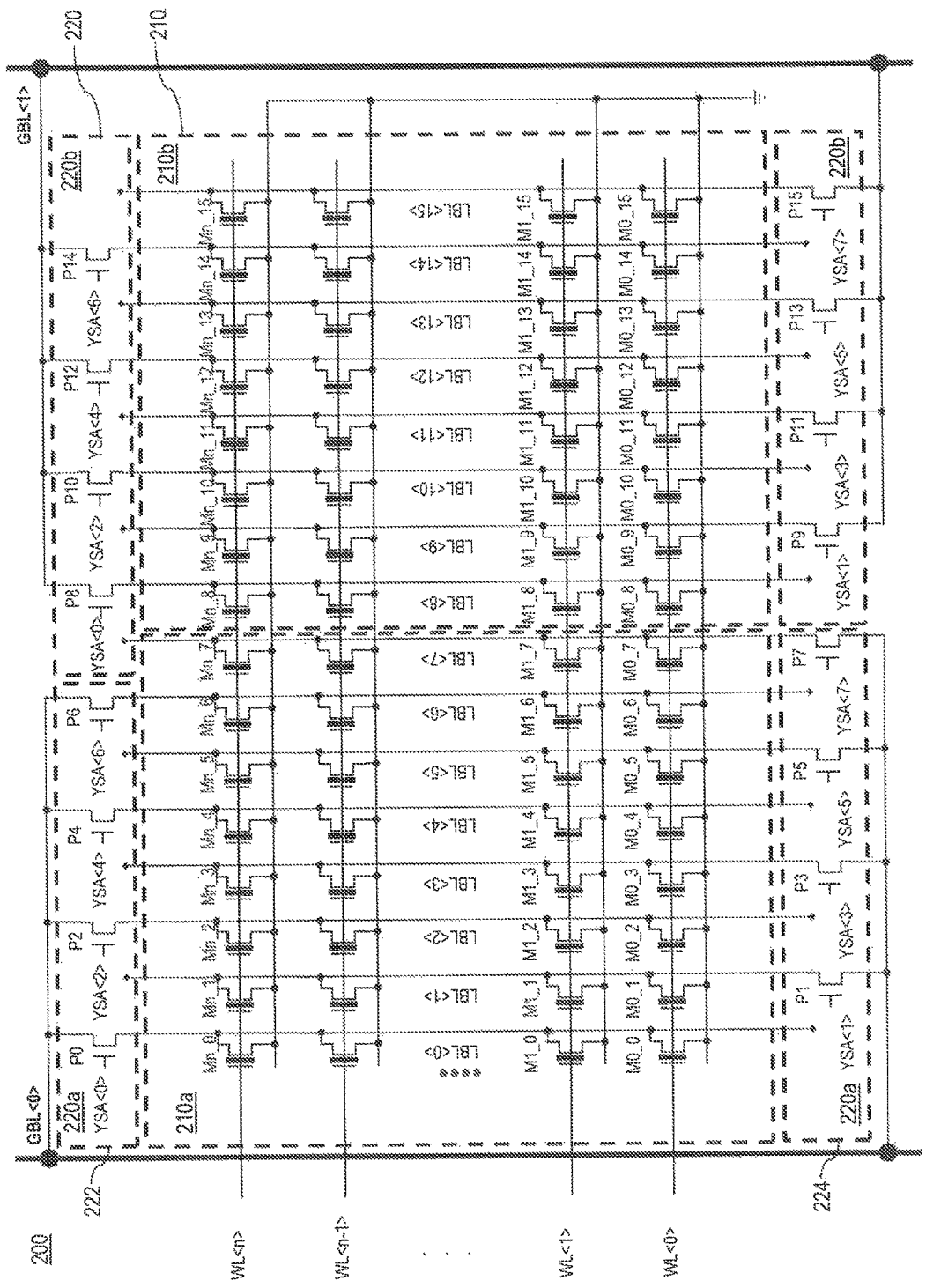
FIG. 2 is a circuit diagram of a memory array and a column decoder of a memory device, according to an illustrated embodiment.

FIG. 2 is a circuit diagram of a memory array 210 and a column decoder 220 of a memory device 200, according to an illustrated embodiment. Memory device 200 is a NOR flash memory device. Memory array 210 includes a first memory array portion 210a and a second memory array portion 210b. Column decoder 220 includes a first column decoder portion 220a and a second column decoder portion 220b having an identical structure. First memory array portion 210a is coupled to a first global bit line GBL<0> via first column decoder portion 220a. Second memory array portion 210b is coupled to a second global bit line GLB<1> via second column decoder portion 220b. Detailed explanation regarding the structure, testing method, and operation of first memory array portion 210a and first column decoder portion 220a is provided below. The structure, control method, and operation of second memory array portion 210b and second column decoder portion 220b are similar to those of first memory array portion 210a and first column decoder 220a, and thus detailed explanation thereof will not be repeated.

First memory array portion 210a includes a plurality of memory cells M0_0, M0_1, ..., and Mn_7, a plurality of local bit lines LBL<0>, LBL<1>, ..., and LBL<7> (hereinafter collectively referred to as "LBL<0:7>"), and a plurality of word lines WL<0>, WL<1>, ..., WL<n−1>, and WL<n> (hereinafter collectively referred to as "WL<0:n>"), where n is an integer greater than or equal to 2.

Memory cells M0_0, M0_1, ..., and Mn_7 are arranged in rows and columns. Each memory cell includes a first terminal coupled to a respective one of local bit lines LBL<0:7>, a second terminal coupled to receive a ground voltage (e.g., 0 V), and a control terminal (e.g., a gate) coupled to a corresponding one of the word lines WL<0:n>. For example, memory cell M0_0 includes a first terminal coupled to local bit line LBL<0>, a second terminal coupled to ground, and a control terminal coupled to word line WL<0>. Each row of memory cells can be categorized as even memory cells and odd memory cells that are alternately arranged along a row direction of parallel rows of memory cells. For example, the row of memory cells M0_0, M0_1, ..., and M0_7 can be categorized as even memory cells M0_0, M0_2, M0_4, and M0_6, alternately arranged with odd memory cells M0_1, M0_3, M0_5, and M0_7.

Word lines WL<0:n> extend in the row direction and are coupled to the control terminals of respective rows of memory cells. For example, word line WL<0> is coupled to the control terminals of the row of memory cells M0_0, M0_1, ..., and M0_7; word line WL<1> is coupled to the control terminals of the row of memory cells M1_0, M1_1, ..., and M1_7; and so on.

Local bit lines LBL<0:7> extend in a column direction of parallel columns of memory cells, and are coupled to the first terminals of respective columns of memory cells M0_0, M0_1, ..., and Mn7. For example, local bit line LBL<0> is coupled to the first terminals of a column of memory cells M0_0, M1_0, ..., and Mn0; local bit line LBL<1> is coupled to the first terminals of a column of memory cells M0_1, M1_1, ..., and Mn_1. Local bit lines LBL<0:7> can be categorized as even local bit lines LBL<0>, LBL<2>, LBL<4>, and LBL<6>, and odd local bit lines LBL<1>, LBL<3>, LBL<5>, and LBL<7>, that are alternately arranged along the row direction. Even local bit lines LBL<0>, LBL<2>, LBL<4>, and LBL<6> are coupled to respective columns of even memory cells. Odd local bit lines LBL<1>, LBL<3>, LBL<5>, and LBL<7> are coupled to respective columns of odd memory cells.

First column decoder portion 220a is coupled between first memory array portion 210a and first global bit line GBL<0>. First column decoder portion 220a includes an upper-half portion 222 and a lower-half portion 224. Upper-half portion 222 includes a plurality of even pass transistors P0, P2, P4, and P6. Lower-half portion 224 includes a plurality of odd pass transistors P1, P3, P5, and P7. Each one of even pass transistors P0, P2, P4, and P6 includes a first terminal coupled the respective one of even local bit lines LBL<0>, LBL<2>, LBL<4>, and LBL<6>, a second terminal coupled to first global bit line GBL<0>, and a control terminal coupled to the respective one of a plurality of even selection lines YSA<0>, YSA<2>, YSA<4>, and YSA<6>. Similarly, each one of odd pass transistors P1, P3, P5, and P7 includes a first terminal coupled to the respective one of odd local bit lines LBL<1>, LBL<3>, LBL<5>, and LBL<7>, a second terminal coupled to first global bit line GBL<0>, and a control terminal coupled to the respective one of a plurality of odd selection lines YSA<1>, YSA<3>, YSA<5>, and YSA<7>. In some embodiment, even pass transistors P0, P2, P4, and P6, and odd pass transistors P1, P3, P5, and P7 are N-type Metal-Oxide-Semiconductor Field-Effect Transistors (N-MOSFETs).

The illustrated configuration of memory device 200 in FIG. 2 is exemplary only, and memory device 200 can include greater or fewer local bit lines, global bit lines, and pass transistors. The number of local bit lines, global bit lines, and pass transistors is not limited. In some embodiments, memory array portions 210a and 210b, and column decoder portions 220a and 220b, may be duplicated multiple times and disposed in a periodic form, with only two portions of the periodic form being shown in FIG. 2.

Figure 3:
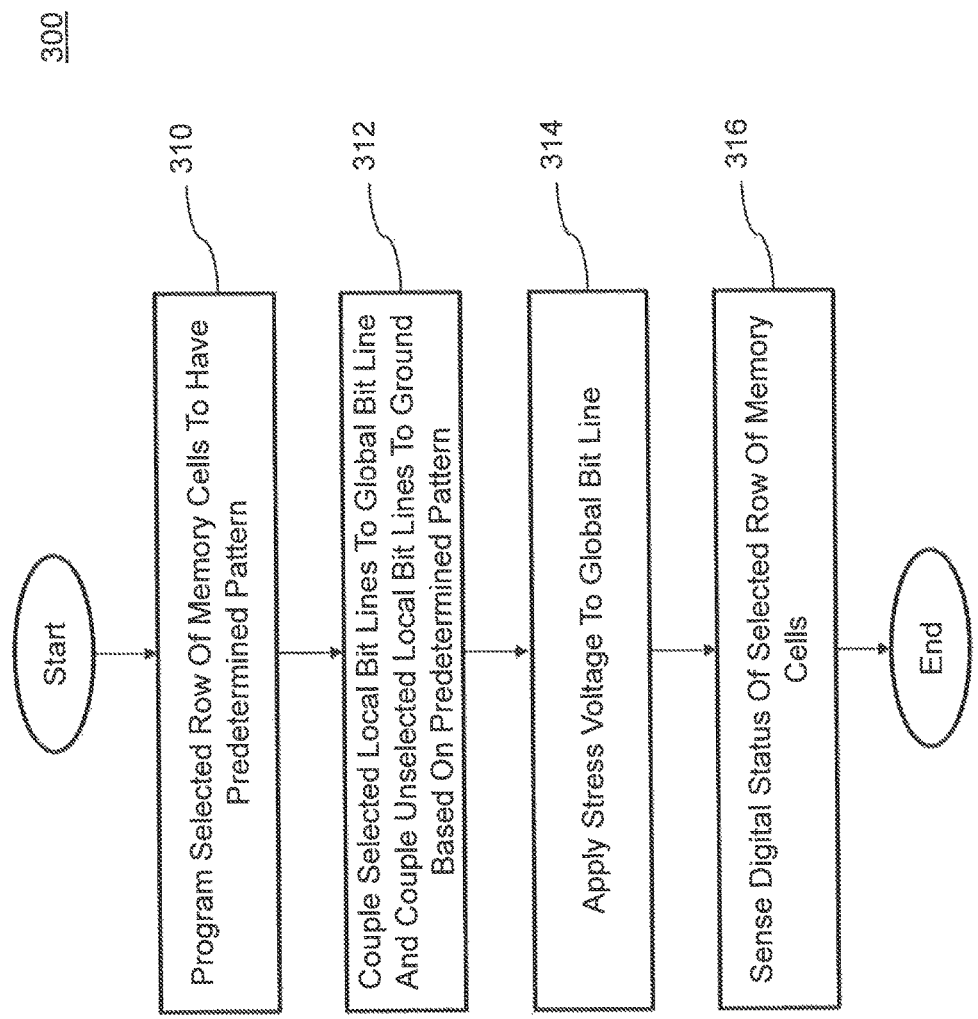
FIG. 3 is a flow chart of a process of performing a stress test on a memory device, according to an illustrated embodiment.

FIG. 3 is a flow chart of a process 300 of performing a stress test on memory device 200, according to an illustrated embodiment. Memory device 200 can be controlled by a control unit, such as control unit 150 of FIG. 1

According to FIG. 3, at step 310, control unit 150 is configured to program a selected row of memory cells corresponding to a selected word line to have a predetermined pattern of digital states. For example, in one embodiment, control unit 150 can program the selected row of memory cells such that all of the odd memory cells in the selected row of memory cells have a first digital state, and all of the even memory cells in the selected row of memory cells have a second digital state. The first digital state is an ON state or a "1" state, and a memory cell having the first digital state has a relatively low threshold voltage. The second digital state is an OFF state or a "0" state, and a memory cell having the second digital state has a relatively high threshold voltage compared to the threshold voltage of the memory cells having the first digital state. In addition, at step 310, control unit 150 also programs the other rows (hereinafter referred to as "unselected rows") of memory cells to have the second digital state.

Figure 4:
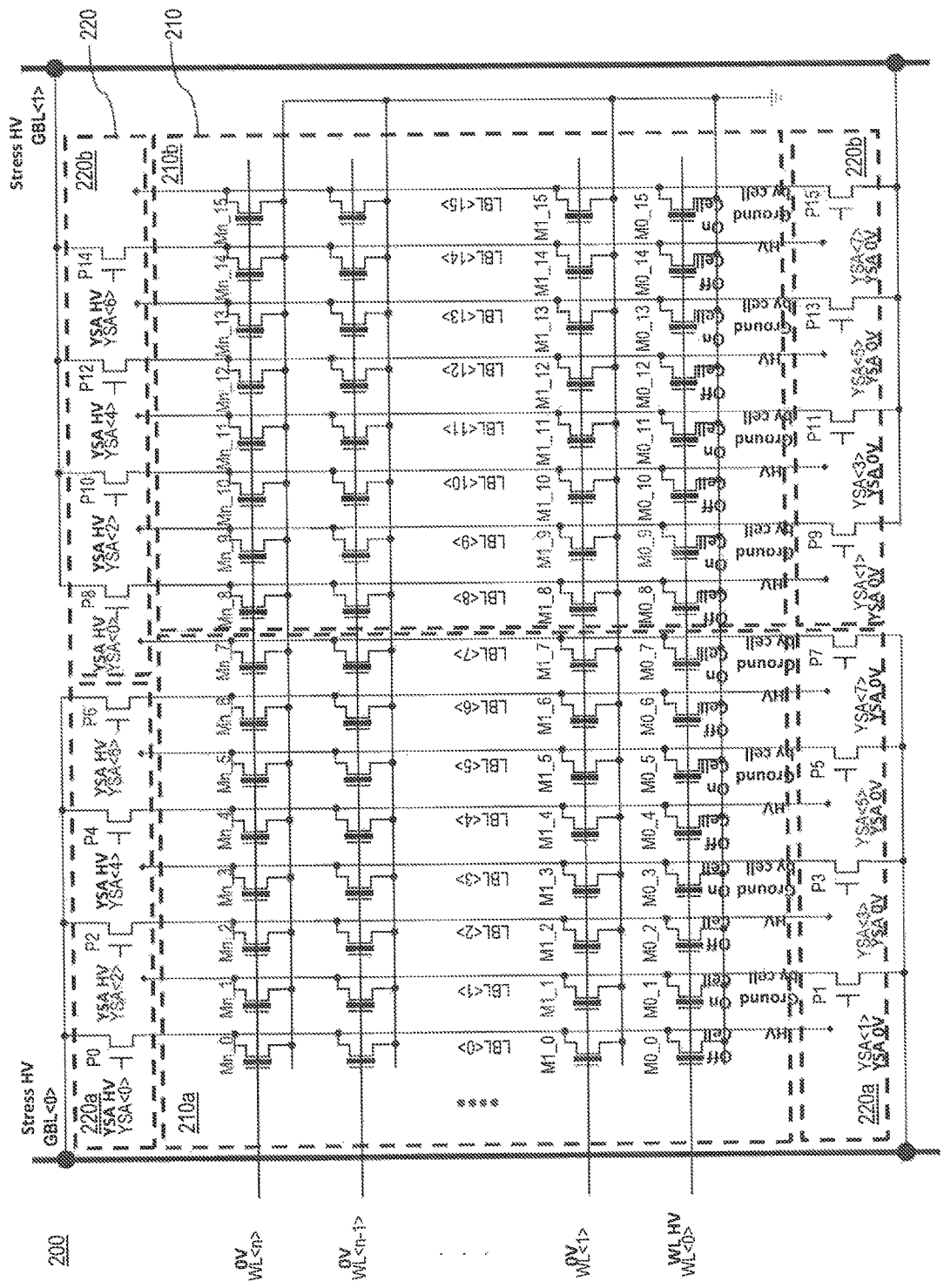
FIG. 4 is a circuit diagram of a memory device during a stress test, according to an illustrated embodiment.

FIG. 4 is a circuit diagram of memory device 200 during a stress test, according to an illustrated embodiment. As illustrated in FIG. 4, control unit 150 selects the row of memory cells M0_0, M0_1, ..., M0_7 corresponding to word line WL<0> as the selected row of memory cells. In the selected row of memory cells M0_0, M0_1, ..., M0_7, control unit 150 programs odd memory cells M0_1, M0_3, M0_5, and M0_7 to have the first digital state (denoted as "ON cell" in FIG. 4), and programs even memory cells M0_0, M0_2, M0_4, and M0_6 to have the second digital state (denoted as "OFF cell" in FIG. 4). Thus, the selected row of memory cells M0_0, M0_1, ..., M0_7 are programmed to have a state pattern of "01010101", with "1" representing the first digital state and "0" representing the second digital state.

In an alternative embodiment, control unit 150 can instead program all of the even memory cells in the selected row of memory cells to have the first digital state, and all of the odd memory cells in the row of memory cells to have the second digital state.

Referring back to FIG. 3, at step 312, control unit 150 couples selected ones of the local bit lines to one of the global bit lines, and couples unselected ones of the local bit lines to ground based on the predetermined pattern of digital states. In particular, control unit 150 couples either ones of the odd local bit lines or even local bit lines that are coupled to the ones of even memory cells or odd memory cells that are programmed to have the second digital state, to the global bit line, and to couple the other ones of odd local bit lines or even local bit lines to ground. For example, if the even memory cells in the selected row of memory cells are programmed to have the second digital state, control unit 150 couples the even local bit lines to the global bit line and couples the odd local bit lines to ground; and if the odd memory cells in the selected row of memory cells are programmed to have the second digital state, control unit 150 couples the odd local bit lines to the global bit line and couples the even local bit lines to ground.

Control unit 150 performs step 312 by applying different voltages to even selection lines YSA<0>, YSA<2>, YSA<4>, and YSA<6>, and odd selection lines YSA<1>, YSA<3>, YSA<5>, and YSA<7>, and applying different voltages to word lines WL<0>, WL<1>, . . . , and WL<n>. For example, in the embodiment illustrated in FIG. 4, when odd memory cells M0_1, M0_3, M0_5, and M0_7 are programmed to have the first digital state and even memory cells M0_0, M0_2, M0_4, and M0_6 are programmed to have the second digital state, control unit 150 applies a selection voltage (denoted as "YSA HV" in FIG. 4) to even selection lines YSA<0>, YSA<2>, YSA<4>, and YSA<6> to turn on even pass transistors P0, P2, P4, and P6 in first column decoder portion 220a, so as to couple even local bit lines LBL<0>, LBL<2>, LBL<4>, and LBL<6> in first memory array portion 210a to first global bit line GBL<0>. Control unit 150 also applies a low voltage such as 0 V (denoted as "YSA 0 V" in FIG. 4) to odd selection lines YSA<1>, YSA<3>, YSA<5>, and YSA<7> to turn off odd pass transistors P1, P3, P5, and P7 in column decoder portion 220a, so as to disconnect odd local bit lines LBL<1>, LBL<3>, LBL<5>, and LBL<7> in first memory array portion 210a from first global bit line GBL<0>.

In addition, control unit 150 applies a first word line voltage to the selected word line coupled to the selected row of memory cells and a second word line voltage to the other word lines (hereinafter referred to as "unselected word lines"). In the embodiment illustrated in FIG. 4, control unit 150 applies a first word line voltage (denoted as "WL HV" in FIG. 4) to word line WL<0> which is coupled to the control terminals of the selected row of memory cells M0_0, M0_1, . . . , M0_7, and applies 0 V to the unselected word lines WL<1>, WL<2>, . . . , and WL<n>. Because odd memory cells M0_1, M0_3, M0_5, and M0_7 are programmed to have a relatively low threshold voltage, odd memory cells M0_1, M0_3, M0_5, and M0_7 are turned on by the first word line voltage applied to word line WL<0>. On the other hand, because even memory cells M0_0, M0_2, M0_4, and M0_6, and the memory cells on the unselected word lines WL<1>, WL<2>, . . . , and WL<n> are programmed to have a relatively high threshold voltage, these memory cells are turned off. Consequently, a current path is formed between the first terminal and the second terminal of each one of odd memory cells M0_1, M0_3, M0_5, and M0_7. Due to the current paths, the voltages on odd local bit lines LBL<1>, LBL<3>, LBL<5>, and LBL<7> that are connected to the first terminals of the respective ones of the odd memory cells M0_1, M0_3, M0_5, and M0_7, are pulled down to ground via the connections to ground of the second terminals of the respective ones of the odd memory cells M0_1, M0_3, M0_5, and M0_7. As a result, odd local bit lines LBL<1>, LBL<3>, LBL<5>, and LBL<7> are coupled to ground (denoted as "Ground by cell" in FIG. 4).

At step 314, control unit 150 applies a stress voltage to the global bit line. For example, in the embodiment illustrated in FIG. 4, control unit 150 applies a stress voltage (denoted as "stress HV" in FIG. 4) to both first global bit line GBL<0> and second global bit line GBL<1>. Because even local bit lines LBL<0>, LBL<2>, LBL<4>, and LBL<6> are coupled to first global bit line GBL<0>, the stress voltage (denoted as "HV" in FIG. 4) is applied to even local bit lines LBL<0>, LBL<2>, LBL<4>, and LBL<6>. On the other hand, because odd local bit lines LBL<1>, LBL<3>, LBL<5>, and LBL<7> are disconnected from first global bit line GBL<0>, odd local bit lines LBL<1>, LBL<3>, LBL<5>, and LBL<7> remain coupled to ground. As a result, a stress voltage is applied between each pair of neighboring local bit lines in memory device 200. In this manner, a stress test is performed on memory device 200.

During the stress test, if a short circuit occurs between one of odd local bit lines LBL<1>, LBL<3>, LBL<5>, and LBL<7> and its neighboring even local bit lines, the programming of one of the odd memory cells M0_1, M0_3, M0_5, and M0_7 that is coupled to the odd local bit line will be changed from the first digital state to the second digital state.

Figure 5:
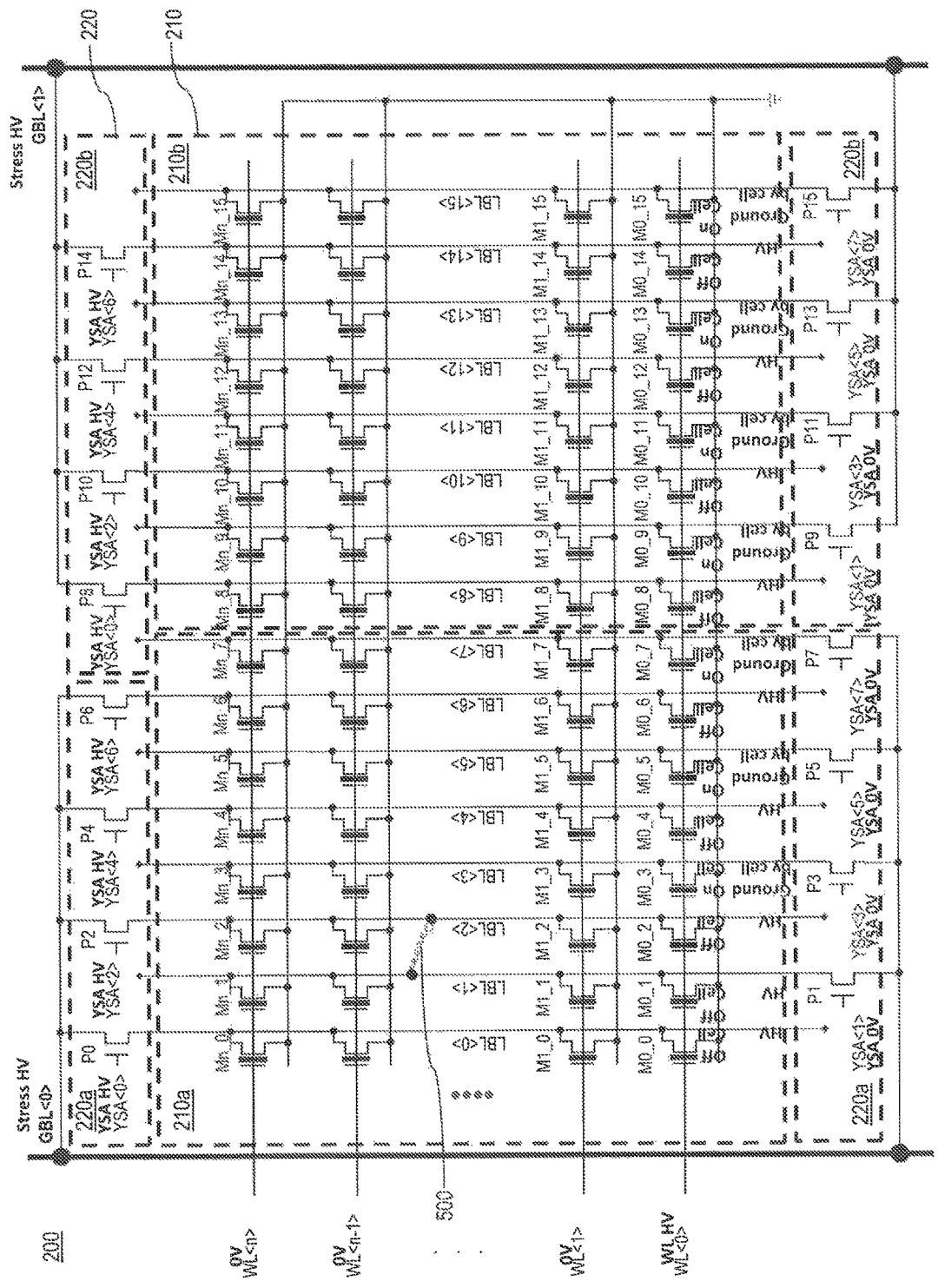
FIG. 5 is a circuit diagram of a memory device when a short circuit occurs between two neighboring local bit lines during a stress test, according to an illustrated embodiment.

FIG. 5 is a circuit diagram of memory device 200 when a short circuit 500 occurs between two neighboring local bit lines during a stress test, according to an illustrated embodiment. As illustrated in FIG. 5, when short circuit 500 occurs between odd local bit line LBL<1> and even local bit line LBL<2> in first memory array portion 210a, a short circuit current path is formed between local bit lines LBL<1> and LBL<2>. As previously described, the stress voltage is applied to even local bit line LBL<2>, while odd local bit line LBL<1> is grounded. Because of the short circuit current path formed between odd local bit line LBL<1> and even local bit line LBL<2>, the voltage on odd local bit line LBL<1> is pulled up from the ground voltage to the stress voltage. Consequently, odd memory cell M0_1, which was pre-programmed to the first digital state (i.e., "ON cell), is programmed to the second digital state (i.e., "OFF cell"), by the word line voltage applied to the control terminal thereof and the stress voltage applied to the first terminal thereof. Thus, the state pattern of the selected row of memory cells M0_0, M0_1, . . . , M0_7 becomes "00010101".

Once odd memory cell M0_1 is programmed to the second digital state, odd memory cell M0_1 is turned off and no longer conducts current. As a result, the voltage on local bit line LBL<1> remains as the stress voltage. Except for odd memory cell M0_1 being programmed to the second digital state, the other odd memory cells M0_3, M0_5, and M0_7 remain in the first digital state. Afterwards, the stress test of memory device 200 can continue to detect other short circuits between the other odd local bit lines LBL<3>, LBL<5>, and LBL<7> and their neighboring even local bit lines.

In the example illustrated in FIG. 5, a short circuit occurs between odd local bit line LBL<1> and even local bit line LBL<2> in an area of first memory array portion 210a. However, a short circuit may occur between odd local bit line LBL<1> and even local bit line LBL<2> in an area of first column decoder portion 220a, e.g., in an area above memory cells Mn_0, Mn_1, . . . , and Mn_7, or in an area below memory cells M0_0, M0_1, . . . , M0_7. In this case, odd memory cell M0_1 will also be programmed into the second digital state. Thus, the stress testing method of the disclosed embodiments can not only detect short circuits in the area of memory array portion 210a, but also detect short circuits in the area of column decoder portion 220a.

Referring back to FIG. 3, at step 316, after the stress testing of memory device 200 has been conducted for a predetermined period of time, control unit 150 senses the digital states of the selected row of memory cells M0_0, M0_1, . . . , M0_7. In particular, control unit 150 controls a sense amplifier (e.g., sense amplifier 130 of FIG. 1) to sense the digital states of the selected row of memory cells M0_0, M0_1, ..., M0_7. If any one of odd memory cells M0_1, M0_3, M0_5, and M0_7 has the second digital state, control unit 150 will determine that a short circuit occurs around one of the odd local bit lines LBL<1>, LBL<3>, LBL<5>, and LBL<7> that is coupled to the odd memory cell. For example, as illustrated in FIG. 5, if sense amplifier 130 senses that the digital state M0_1 changes from the first digital state to the second digital state, control unit 150 will determine that a short circuit occurs around odd local bit line LBL<1>.

The structure and stress testing method of first memory array portion 210a has been described. It will now be apparent to those skilled in the art that second memory array portion 210b has a similar structure and stress testing method as described for first memory array portion 210a.

In addition, it will now be apparent to those skilled in the art that process 300 is not limited to the embodiment illustrated in FIG. 3. That is, process 300 can include one or more of steps illustrated in FIG. 3. In addition, process 300 can include one or more additional steps. Moreover, the sequence of the steps in process 300 is not limited to the embodiment illustrated in FIG. 3. For example, instead of performing step 316 after step 314 in the embodiment illustrated in FIG. 3, step 316 can be performed before step 314.

The stress testing method and system for the memory device according to the disclosed embodiments have distinct advantages over conventional art. The stress testing method of the disclose embodiments can detect more than one short circuit in the memory device without interruption by any short circuit. On the other hand, in a conventional stress testing method, when a short circuit is detected, the entire stress testing will be stopped. In addition, the stress testing method of the disclosed embodiments can detect short circuits in both of a memory array area and a column decoder area. Therefore, compared to the conventional stress testing method, the stress testing method of the disclosed embodiments is more efficient.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A memory device, comprising:
   a memory cell array including:
      a plurality of memory cells arranged in rows and columns;
      a plurality of word lines extending in a row direction and coupled to respective rows of the memory cells; and
      a plurality of local bit lines extending in a column direction and coupled to respective columns of the memory cells; and
   a control unit configured to:
      program a selected one of the rows of memory cells to have a predetermined pattern of digital states;
      couple selected ones of the local bit lines to a global bit line and couple unselected ones of the local bit lines to ground based on the predetermined pattern;
      apply a stress voltage to the global bit line; and
      after a predetermined period of time, sense the digital states of the selected row of memory cells.

2. The memory device of claim 1, wherein each row of memory cells including even memory cells and odd memory cells alternately arranged along the row direction,
   the control unit being configured to, when programming the selected row of memory cells to have the predetermined pattern of digital states:
      program ones of the even memory cells or odd memory cells in the selected row of memory cells to have a first digital state;
      program the other ones of the even memory cells or odd memory cells in the selected row of memory cells to have a second digital state; and
      program unselected rows of memory cells to have the second digital state,
   a threshold voltage of the memory cells having the first digital state being lower than a threshold voltage of the memory cells having the second digital state.

3. The memory device of claim 2, wherein the plurality of local bit lines include even local bit lines coupled to the even memory cells and odd local bit lines coupled to the odd memory cells,
   the control unit being configured to, when coupling the selected ones of the local bit lines to the global bit line and coupling the unselected ones of the local bit lines to ground based on the predetermined pattern:
      if the even memory cells in the selected row of memory cells are programmed to have the second digital state, couple the even local bit lines to the global bit line and couple the odd local bit lines to ground; and
      if the odd memory cells in the selected row of memory cells are programmed to have the second digital state, couple the odd local bit lines to the global bit line and couple the even local bit lines to ground.

4. The me device of claim 3, further including a column decoder including:
   a plurality of even pass transistors coupled between the global bit line and respective ones of even local bit lines and; and
   a plurality of odd pass transistors coupled between the global bit line and respective ones of odd local bit lines,
   wherein the control unit is configured to:
   when coupling the even local bit lines to the global bit line and coupling the odd local bit lines to ground, turn on the even pass transistors and turn off the odd pass transistors; and
   when coupling the odd local bit lines to the global bit line and coupling the even local bit lines to ground, turn on the odd pass transistors and turn off the even pass transistors.

5. The memory device of claim 4, wherein the even pass transistors and odd pass transistors are N-type Metal-Oxide-Semiconductor Field-Effect Transistors (N-MOSFETs).

6. The memory device of claim 2, wherein the control unit is further configured to, after the predetermined period of time:
   if the digital state of one of the memory cells which were programmed to have the first digital state, changed to the second digital state, determine that a short circuit occurs around the local bit line coupled to the memory cell.

7. The memory device of claim 3, wherein the control unit is further configured to:
   apply a first word line voltage to a selected word line coupled to the selected row of memory cells; and
   apply a second word line voltage to unselected word lines in the memory array.

8. The memory device of claim 1, wherein each of the memory cells includes a control terminal coupled to a respective word line, a first terminal coupled to the respective local bit line, and a second terminal coupled to receive a ground voltage.

9. A method for stress testing a memory device, comprising:
providing a memory cell array including:
a plurality of memory cells arranged in rows and columns;
a plurality of word lines extending in a row direction and coupled to respective rows of the memory cells; and
a plurality of local bit lines extending in a column direction and coupled to respective columns of the memory cells;
programming a selected one of the rows of memory cells to have a predetermined pattern of digital states;
coupling selected ones of the local bit lines to a global bit line based on the predetermined pattern, and coupling unselected ones of the local bit lines to ground;
applying a stress voltage to the global bit line; and
after a predetermined period of time, sensing the digital states of the selected row of memory cells.

10. The method of claim 9, wherein each row of memory cells including even memory cells and odd memory cells alternately arranged along the row direction,
the programming the selected row of memory cells to have the predetermined pattern of digital states including:
programming ones of the even memory cells or odd memory cells in the selected row of memory cells to have a first digital state;
programming the other ones of the even memory cells or odd memory cells in the selected row of memory cells to have a second digital state; and
programming unselected rows of memory cells to have the second digital state,
a threshold voltage of the memory cells having the first digital state being lower than a threshold voltage of the memory cells having the second digital state.

11. The method of claim 10, wherein the plurality of local bit lines include even local bit lines coupled to the even memory cells and odd local bit lines coupled to the odd memory cells,
the coupling the selected ones of the local bit lines to the global bit line and coupling the unselected ones of the local bit lines to ground based on the predetermined pattern including:
if the even memory cells in the selected row of memory cells are programmed to have the second digital state, coupling the even local bit lines to the global bit line and coupling the odd local bit lines to ground; and
if the odd memory cells in the selected row of memory cells are programmed to have the second digital state, coupling the odd local bit lines to the global bit line and coupling the even local bit lines to ground.

12. The method of claim 11, further including:
providing a column decoder including:
a plurality of even pass transistors coupled between the global bit line and respective ones of even local bit lines and; and
a plurality of odd pass transistors coupled between the global bit line and respective ones of odd local bit lines,
wherein the method further includes:
when coupling the even local bit lines to the global bit line and coupling the odd local bit lines to ground, turning on the even pass transistors and turning off the odd pass transistors; and
when coupling the odd local bit lines to the global bit line and coupling the even local bit lines to ground, turning on the odd pass transistors and turning off the even pass transistors.

13. The method of claim 11, further including:
applying a first word line voltage to a selected word line coupled to the selected row of memory cells; and
applying a second word line voltage to unselected word lines in the memory array.

14. The method of claim 10, further including:
turning on the ones of the even memory cells and odd memory cells in the selected row of memory cells that were programmed to have the first digital state; and
turning off the other ones of the even memory cells and odd memory cells in the selected row of memory cells that were programmed to have the second digital state.

15. The method of claim 10, further including:
after the predetermined period of time, if the digital state of one of the memory cells which were programmed to have the first digital state, changed to the second digital state, determining that a short circuit occurs around the local bit line coupled to the memory cell.

16. The method of claim 9, wherein providing the memory cell array including:
coupling a first terminal of each of the memory cells to a respective one of the local bit lines;
coupling a second terminal of each of the memory cells to ground; and
coupling a control terminal of each of the memory cells to a respective one of the word lines.

* * * * *